United States Patent [19]

Kameya

[11] Patent Number: 4,507,628
[45] Date of Patent: Mar. 26, 1985

[54] DELAY LINE

[75] Inventor: Kazuo Kameya, Saitama, Japan

[73] Assignee: Elmec Corporation, Japan

[21] Appl. No.: 513,493

[22] Filed: Jul. 13, 1983

[30] Foreign Application Priority Data

Jul. 14, 1982 [JP] Japan .................. 57-122629

[51] Int. Cl.³ .............................................. H03H 7/32
[52] U.S. Cl. .................................. 333/138; 333/140; 336/225
[58] Field of Search .............................. 333/138–140, 333/23, 156, 162; 336/225, 229; 29/600, 602 R, 605

[56] References Cited

U.S. PATENT DOCUMENTS 4,160,962  7/1979  de Keyser et al. .............. 333/156

FOREIGN PATENT DOCUMENTS 222187  9/1924  United Kingdom .............. 333/138

Primary Examiner—Marvin L. Nussbaum
Attorney, Agent, or Firm—Sughrue, Mion, Zinn, Macpeak, and Seas

[57] ABSTRACT

Disclosed is an electromagnetic type delay line comprising an inductance element formed of a coiled conductor and a plurality of capacitors connecting the conductor to ground and consequently possessing a plurality of sections. The inductance element is formed by coiling the conductor at a prescribed pitch in the shape of a single-layer solenoid. In the inductance element, the one-turn pitch P and half-turn pitch B are selected so as to satisfy the expression, $B/P \geq 1.0$. Owing to this construction, the coupling coefficients between the individual sections of the inductance element can be easily approximated to the theoretically optimum values.

5 Claims, 13 Drawing Figures

DELAY LINE

BACKGROUND OF THE INVENTION (1) Field of the Invention

This invention relates to a lumped-constant type delay line made of an inductance element and capacitors, and more particularly to a subminiature ultra-high speed delay line possessing a very fast rise time and befitting digital circuits.

(2) Description of the Prior Art

Heretofore, delay lines having a fast rise time on the order of less than 1 ns, for example, which are made of coaxial cables cut to lengths appropriate for particular delay times desired have been preponderantly used.

The delay lines made of such coaxial cables are large and entail troublesome treatment as regards terminals. Further, they have no fixed size because their lengths vary with the length of delay time they are expected to generate. Thus, they pose some difficulty when they are to be laid out in conjunction with other semiconductor components in a printed circuit board for the production of an electronic apparatus.

Lumped-constant type delay lines combining an inductance element of the type having a conductor coiled on a bobbin and capacitors are also available. These lumped-constant type delay lines, however, have a disadvantage in that their inductance element assume a frequency characteristic when their frequency exceeds levels of around 1 GHz, for example, the inductance element are not easily coupled in optimum conditions, and their magnitudes of Q tend to decline so much as to impair their delay and amplitude characteristics. In these circumstances, it has been thought that these delay lines will not easily acquire good delay characteristics, especially ultra-high speed delay characteristics requiring a rise time of not more than 1 ns.

SUMMARY OF THE INVENTION

It is a primary object of this invention to provide a lumped-constant type ultra-high speed delay line which permits the coupling in an inductance element constituting part of the delay line to be easily adjusted to the theoretically optimum condition, and which consequently acquires an advantageous delay characteristic at ultra-high frequencies.

Another object of this invention is to provide a subminiature delay line having an inductance element coupled in the optimum condition.

Yet another object of this invention is to provide a delay line which is easily manufactured.

Still another object of this invention is to provide a delay line which suffers no appreciable loss at ultra-high frequencies.

A further object of this invention is to provide a delay line useful as a variable delay line which permits a variation in the delay time.

To accomplish these objects, according to the present invention, there is provided a delay line comprising an inductance element formed of a coiled conductor and a plurality of capacitors connecting the aforementioned conductor to ground and consequently possessing a plurality of sections, which delay line is characterized by having the aforementioned conductor of the inductance element coiled in a spaced manner with a prescribed pitch and formed in the shape of a single-layer solenoid, with the one-turn pitch P and the half-turn pitch B of the aforementioned inductance element selected so as to satisfy the relation, $B/P \geq 1.0$.

In accordance with the construction of this invention as described above, the coupling between the adjacent sections of the inductance element of the delay line can be obtained in a state approximating the theoretical optimum value. Thus, the delay line can acquire an advantageous delay characteristic at ultra-high frequencies warranting a fast rise time, for example, and can be easily miniaturized.

These and other objects and characteristic features of the present invention will become apparent from the further disclosure in the following description of preferred embodiments with reference to the accompanying drawings.

DETAILED DESCRIPTION OF THE PREFERRED EMBODIMENT

The principle of this invention will first be described with reference to FIGS. 1 through 5.

Figure 1:
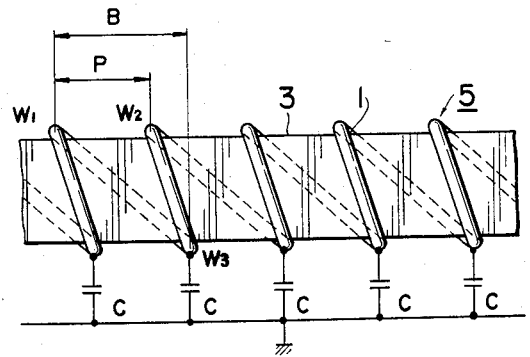
FIG. 1 is a schematic front view illustrating the principle of a delay line according to the present invention.
Figure 2:
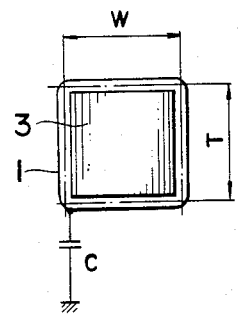
FIG. 2 is a schematic side view of the delay line illustrated in FIG. 1.

As illustrated in FIG. 1 and FIG. 2, a conductor 1 is coiled in a spaced manner with a pitch P and is formed in the shape of a single-layer solenoid on a bar-shaped non-magnetic bobbin 3 of square cross-sectional shape having thickness T and width W, to form an inductance element 5. In this inductance element 5, the conductor 1 is coiled so that adjacent turns slightly overlap.

The pitch from a given conductor portion $W_1$ to the immediately next conductor portion $W_2$ (see FIG. 1) both lying in the direction of width W, on the upper side of the bobbin 3 as illustrated in FIG. 2 is denoted the one-turn pitch P. The pitch from the conductor portion $W_1$ on the upper side of the bobbin 3 to the conductor portion $W_3$ at the lower side of the bobbin 3 and between $W_1$ and $W_2$ along the length of the conductor is denoted the a half-turn pitch B. According to the invention, the half-turn pitch B has a length greater than the one-turn pitch P. It should be noted that precisely speaking, the thickness T and the width W of the inductance element 5 are considered as the distances between the axes of the portions of the conductor 1 falling on opposite sides in the respective directions of thickness and width of the bobbin 3, as shown in FIG. 2.

Each one-turn portion of the inductance element 5 is reckoned as an inductance L. For each turn, the conductor 1 is connected via a capacitor C to ground. One inductance L forms one section of the delay line. As illustrated in the equivalent circuit diagram of FIG. 3, each inductance L forms mutual induction with the another inductances L.

Figure 3:
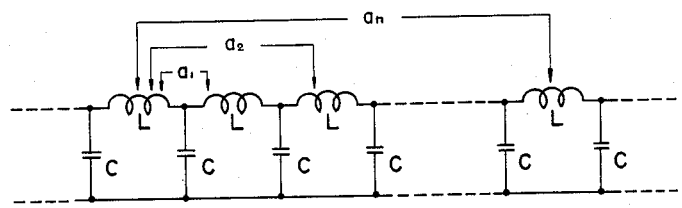
FIG. 3 is an equivalent circuit diagram of the delay line illustrated in FIG. 1.

FIG. 3 illustrates the condition in which the leftmost inductance L is coupled with inductances L lying to the right thereof. Naturally, other inductances L lie to the left thereof and the inductance L under discussion is coupled with such inductances L. Each of these other inductances are mutually inductive with the inductances L lying on both sides thereof.

Each inductance L is coupled with a first neighboring inductance L at a coupling coefficient $a_1$, with a second neighboring inductance L at a coupling coefficient $a_2$, and with an n'th neighboring inductance L at a coupling coefficient $a_n$.

Now the delay line constructed as described above will be studied. First, the coupling coefficients $a_1, a_2, \ldots, a_n$ will be determined.

Figure 4:
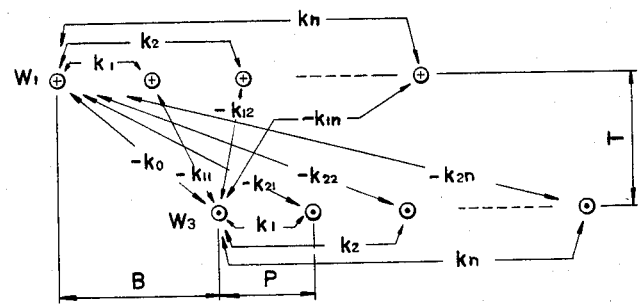
FIG. 4 is a diagram illustrating the condition of the couplings formed in the inductance element of the delay line illustrated in FIG. 1.

A given conductor portion $W_1$ running in the direction of the width W on the upper side of the bobbin 3 and a conductor portion $W_3$ separated from the conductor portion $W_1$ by a half-turn (longitudinal distance B) B and falling on the lower side of the bobbin 3 as illustrated on FIG. 1 are taken as standard lines. It is then assumed that the coupling coefficients between the portions of the conductor 1 lying on the upper side of the bobbin 3 and those between the portions of the conductor 1 lying on the lower side of the bobbin 3 are sequentially represented as $k_1, k_2, \ldots, k_n$ and the coupling coefficients between the portions of the conductor 1 lying on the upper side and those lying on the lower side respectively of the bobbin 3 are sequentially represented as $k_0, k_{11}, k_{12}, \ldots k_{1n}, k_{21}, k_{22} \ldots k_{2n}$ as illustrated in FIG. 4.

As regards the directions in which the electric current flows in the standard conductor portions $W_1$ and $W_8$, since the direction of the flow of electric current is the same among the portions of the conductor 1 lying on the upper side of the bobbin 3 and among those on the lower side of the bobbin 3 respectively, the coupling coefficients $k_1, k_2, \ldots, k_n$ assume positive values. The electric current flows in opposite directions as between the portions of the conductor 1 lying on the upper side and those on the lower side, respectively, of the bobbin 3. Thus, the coupling coefficients, $k_0, k_{11}, k_{12}, \ldots k_{1n}$ and $k_{21}, k_{22}, \ldots k_{2n}$ assume negative values. The absolute values of these coupling coefficients decrease proportionally as the distances between the relevant portions of the conductor 1 increase.

For the sake of simplicity in description, it is assumed that the width W and the thickness T of the bobbin 3 illustrated in FIG. 2 have a relation $W \gg T$ and that the portions of the conductor 1 running in the direction of width W predominantly affect the delay characteristic. Then, the coupling coefficients $a_1, a_2, a_n$ between the sections of the delay line may be represented as follows.

$$a_1 = \frac{2 k_1 - k_{11} - k_{21}}{2(1 - k_0)} \quad (1)$$

$$a_2 = \frac{2 k_2 - k_{12} - k_{22}}{2(1 - k_0)} \quad (2)$$

$$a_n = \frac{2 k_n - k_{1n} - k_{2n}}{2(1 - k_0)} \quad (3)$$

The delay characteristic of the delay line is mainly determined by the coupling coefficients, $a_1$ and $a_2$. The effect of the coupling coefficient $a_1$ is particularly conspicuous. This coupling coefficient $a_1$ generally assumes a positive sign. On the assumption that the coupling coefficient $a_2$ and the subsequent ones are all absent, the optimum value of coupling coefficient $a_1$ is found by the conventional theoretical calculation to be 0.142 (corresponding to $m=1.34$ in the derived m-type). In actuality, however, the presence of the coupling coefficient $a_2$ and the subsequent ones and the effects of the stray capacitance and other factors must be taken into account. Thus, it is generally held satisfactory for the coupling coefficient $a_1$ to be selected within the range of about 0.1 to 0.2.

Theoretically the coupling coefficient $a_2$ assumes a negative sign and the absolute value is desired to fall in the range of about 0.02 to 0.03. The coupling coefficients $a_3, \ldots a_n$ have substantially negligible values. Thus, a delay line exhibiting an advantageous delay characteristic in a wide range of frequencies can be obtained by selecting the coupling coefficients $a_1$ and $a_2$ within the aforementioned optimum ranges.

The present inventor has made a diligent study in search of a measure capable of attaining the optimum values for the coupling coefficients $a_1$ and $a_2$ and took special note of the one-turn pitch P and the half-turn pitch B of the conductor 1 constituting part of the inductance element 5. He has consequently found that the coupling coefficients $a_1$ and $a_2$ can be adjusted to substantially the theoretically optimum values by suitably selecting the pitches P and B.

Figure 5:
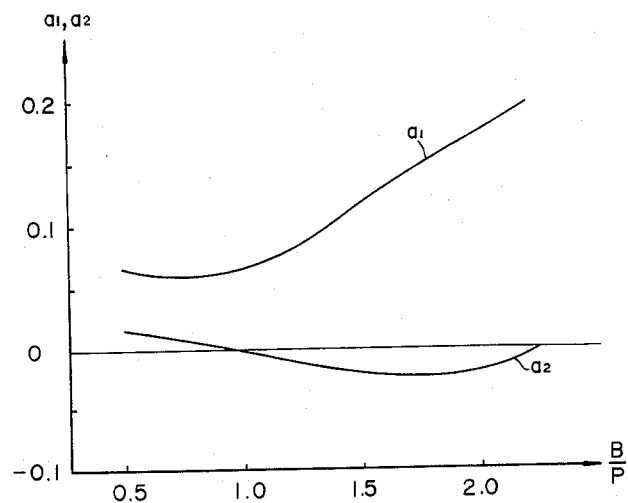
FIG. 5 is a characteristic diagram showing the change in the coupling coefficient in the delay line of FIG. 1.

A theoretical analysis performed on the assumption that the width, W, of the inductance element 5 is 10 mm, the thickness, T, thereof is 1.4 mm, the one-turn pitch P is 2 mm, and the diameter of the conductor 1 is 0.25 mm, for example reveals that the coupling coefficients $a_1$ and $a_2$ vary as illustrated in FIG. 5 when the relation between the one-turn pitch P and the half-turn pitch B, i.e. B/P, is changed in the range of 0.5 to 2.2. From this graph, it is confirmed that the coupling coefficient $a_1$ decreases and then increases in the positive range as the ratio of B/P is increased and the coupling coefficient $a_2$ decreases from positive to negative and again increases and reaches the positive range as the ratio of B/P is increased.

It is, therefore, clear from FIG. 5 that the desired selection of the coupling coefficient $a_1$ in the range of 0.1 to 0.2 and the coupling coefficient $a_2$ in the range of $-0.02$ to $-0.03$ can be accomplished by selecting the value of the ratio of B/P in the range of about 1.0 to 2.0.

Since the manufacture of the inductance element 5 becomes difficult when the ratio of B/P exceeds 2.0, it is practically safe to define this ratio simply by the expression, $B/P \geq 1.0$.

The reason why the coupling coefficient $a_2$ can assume a negative sign is that, as is clear from the aforementioned formula (2) and the diagram of FIG. 4, the value of the coupling coefficient $k_{12}$ can be increased by decreasing the distance between the portions of the conductor which concern the coupling coefficient $k_{12}$.

As regards the coupling coefficient $a_1$, its value can be decreased and the relevant portions of the conductor 1 can be brought closer toward each other because the value of the coupling coefficient $k_{11}$ can be increased. As the result, the delay line can be miniaturized. These facts also constitute characteristic features of the present invention.

In the inductance element 5 illustrated in FIG. 1, the coupling coefficients $a_1$ and $a_2$ can be substantially adjusted to their theoretically optimum values without reference to various conditions such as the size and material of the bobbin 3 and the diameter of the conductor, by fixing the one-turn pitch P and the half-turn pitch B of the inductance element 5 so as to satisfy the expression, $B/P \geq 1.0$. Consequently, there is obtained an ultra-high speed delay line exhibiting an advantageous delay characteristic at ultra-high frequencies.

Now, on the basis of the preceding theoretical analysis of the delay line, preferred embodiments of the present invention will be described below.

Figure 6:
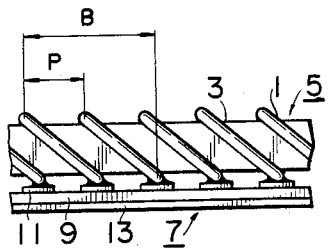
FIG. 6 is a partial front view of a preferred embodiment of the delay line of this invention.
Figure 7:
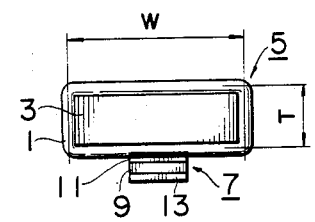
FIG. 7 is a side view of the delay line of FIG. 6.

In FIG. 6 and FIG. 7, an inductance element 5 is formed by coiling a silver-plated bare conductor 1 spaced at a one-turn pitch P and a half-turn pitch B in the shape of a single-layer solenoid on the outer periphery of a bar-shaped non-magnetic bobbin 3 of a rectangular cross section having a larger size in the direction of width W than in the direction of thickness T, so that the adjacent turns of the coiled conductor overlap.

The relation between the one-turn pitch P and the half-turn pitch B, namely, the ratio of B/P, is selected so that, depending on the width W, the thickness T, the one-turn pitch P, the diameter of the conductor 1, etc., the coupling coefficients $a_1$ and $a_2$ will be adjusted to the aforementioned optimum values.

For each turn of the inductance element 5, the conductor 1 is connected via a capacitor element 7 to ground. This capacitor element 7 is formed of a dielectric plate 9 extended in the longitudinal direction below the bobbin 3, a plurality of capacitor electrodes 11 disposed on the upper side of the dielectric plate 9 spaced at the same pitch as the conductor 1, and a ground electrode 13 disposed on the lower side of the dielectric plate 9. The portions of the conductor 1 lying on the lower side of the inductance element 5 and the capacitor electrodes 11 are joined by the reflow soldering method, for example. Consequently, there is obtained an electromagnetic delay line possessing a plurality of sections.

Although the delay line constructed as described above has various components such as the bobbin 3 and the conductor 1 packed in a subminiature construction, it enjoys ultra-high speed operation and achieves an advantageous delay characteristic not attained by the conventional lumped-constant type delay line. Moreover, since the greater part of the conductor 1 of the inductance element 5 is separated from the ground electrode 13, the inductance element 5 does not suffer any appreciable loss due to excess current and rises to a very small height structurally.

In the delay line illustrated in FIG. 6, the conductor 1 is joined to a capacitor element 7 by soldering at each turn of the inductance element 5 and, therefore, is enabled to stand by itself. Optionally, therefore, the delay line may be converted into a coreless solenoid construction by extracting the non-magnetic bobbin 3 from the coil of the delay line. The conversion to the coreless solenoid construction results in a further decline in the dielectric loss of the bobbin 3 at ultra-high frequencies.

Figure 8:
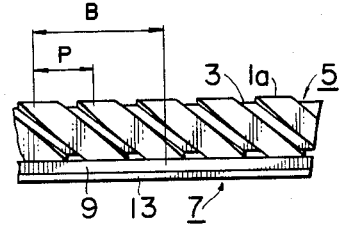
FIG. 8 is a partial front view of another embodiment of this invention.
Figure 9:
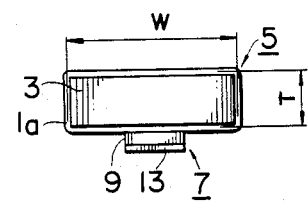
FIG. 9 is a side view of the delay line of FIG. 8.

FIG. 8 and FIG. 9 depict another embodiment of the present invention.

In this delay line, the inductance element 5 is formed by coiling a conductor strip 1a on a non-magnetic bobbin 3 of rectangular cross section, so that the portions of the conductor strip 1a lying on the lower side of the bobbin 3 will concurrently play the part of the capacitor electrodes 11 illustrated in FIG. 6 and, at the same time, will be combined with the capacitor element 7 opposed to the ground electrode 13 across the dielectric plate 9.

With this construction, the delay line acquires an advantageous delay characteristic and permits simplification of the construction of the capacitor element 7 when the relation between the one-turn pitch P and the half-turn pitch B are selected so as to satisfy the expression, $B/P \geq 1.0$.

In either of the foregoing embodiments of this invention, the inductance element is constructed so that only the portions of the conductor lying is the direction of width W will manifest the effect sought by the invention. In accordance with this invention, the inductance element can be formed so that the effect of this invention may be obtained with respect to the portions of the conductor lying on either of the sides of the bobbin in the directions of width W and thickness T illustrated in FIG. 2.

Figures 10A, 10B:
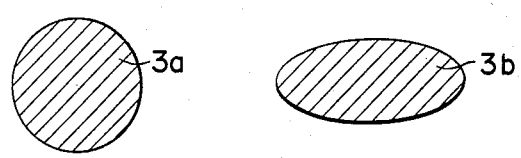
FIG. 10(A) and FIG. 10(B) are sectional views of other typical bobbins usable in the delay line of this invention.

This invention is not restricted by the shape of the cross section of a bobbin to be used. In the place of the bobbin 3 of rectangular cross section, for example, a bobbin 3a having a circular cross section as illustrated in FIG. 10(A) or a bobbin 3b having an elliptic cross section as illustrated in FIG. 10(B) may be used. Even with the bobbin 3a or 3b, it suffices for the purpose of this invention to form the inductance element 5 under conditions satisfying the expression, $B/P \geq 1.0$.

Figure 11:
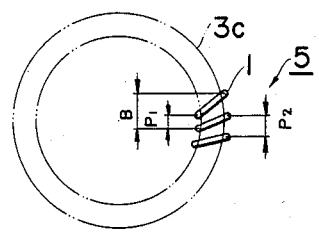
FIG. 11(A) and FIG. 11(B) are respectively a plan view and a cross sectioal view of another typical inductance element for the delay line of the present invention.
Figure 11B:
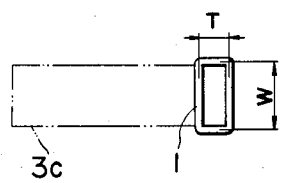

FIG. 11 depicts yet another embodiment of this invention in a plan view and a cross section respectively.

In the delay line illustrated, a toroidal non-magnetic bobbin 3c (indicated by a two-dot-and-one-dash line in the drawing) is used in the place of the bar-shaped non-magnetic bobbin 3 illustrated in FIG. 6, and an inductance element 5 is formed by coiling a conductor 1 in the shape of a single-layer solenoid on the toroidal bobbin 3c (showing three turns of the conductor in the drawing).

In this delay line, the pitch $P_1$ of the coil on the inner side of the toroidal bobbin 3c and the pitch $P_2$ thereof on the outer side of the bobbin are different and naturally satisfy the relation $P_1 < P_2$. In this case, it suffices to consider the relation between the one-turn pitch P and the half-turn pitch B by assuming the one-turn pitch P to be the average of the inner pitch $P_1$ and the outer pitch $P_2$, thus $P = (P_1 + P_2)/2$. The capacitors used in this delay line are omitted from the drawings.

The delay line which uses a toroidal bobbin 3c as described above may be modified to afford a miniature variable delay line which is easy to operate by forming a circular row of fixed contacts on the conductor 1, providing a movable contact supported on a fulcrum placed at the center of the toroidal bobbin 3c, and allowing this movable contact to slide on the circular row of fixed contacts.

The various effects mentioned above are not the only characteristics possessed by this invention. The following salient characteristics are also possessed by the invention.

In the present invention, the coupling coefficients which determine the delay characteristic of the delay line are not the absolute values of the dimensions of component elements of the delay line but are fixed by the ratios of the above dimensions and, at the same time, the dimensions of the component elements of the delay line have a distinct relationship with the various properties. To be specific, when the dimensions of the component elements of the delay line are reduced by a fixed ratio such as, for example, 1/S (on condition that value of the capacitors C are similarly reduced by the ratio of 1/S), the delay time and the rise time decrease to 1/S their respective original values (with the −3 dB pass band alone multiplied by S), the area of installation decreases to $1/S^2$ the original value, and the volume decreases to $1/S^3$ the original value. Despite these changes, the characteristic impedance remains intact.

This fact implies that effective subminiaturization enables the delay line of the present invention to enjoy notable improvements in speed and in the compactness of design.

Further, the inductance element used in the delay line of this invention has a very simple construction which suits subminiaturization.

Optionally, the inductance element may be formed by covering the surface of a non-magnetic bobbin of alumina ceramics with a layer of conductor by a plating technique, and subsequently cutting the coated surface of the bobbin by any of the conventionally known techniques such as, for example, mechanical precision cutting, photo-etching, and laser beam cutting thereby allowing the layer of conductor to remain in the shape of a single-layer solenoid, instead of coiling a conductor 1 on a bobbin. The shape of the cross section of the conductor or any other conducting element can be freely selected. Thus, the inductance element formed of a coiled conductor as contemplated by the present invention is not limited to the coiling of a conductor (conductive wire) in the narrow sense of these words.

Further, the capacitor element which is combined with the inductance element to form the delay line can be easily formed by depositing a dielectric element and ground electrodes on the inductance element by a high-speed sputtering technique, for example.

As described above, in the delay line of the present invention, the coupling coefficients between the turns of the coiled conductor can be easily adjusted to the optimum values, the rise time shortened in a wide range of frequencies, particularly in the ultra-high frequencies, the delay characteristic improved, and the miniaturization and compactiveness of the overall construction achieved.

What is claimed is:

1. A delay line, comprising; an inductance element formed of a coiled conductor and a plurality of capacitors connecting said conductor to ground, said conductor of said inductance element being coiled in the shape of a single-layer solenoid with adjacent turns of said conductor being spaced from one another, a one-turn pitch P and a half-turn pitch B of said inductance element being selected so as to satisfy the relation, $B/P \geq 1.0$.

2. A delay line according to claim 1, wherein said inductance element is formed by coiling said conductor on a non-magnetic bobbin.

3. A delay line according to claim 1, wherein said inductance element is coreless.

4. A delay line according to claim 1 or claim 2, wherein said inductance element is formed in an annular shape.

5. A delay line according to claim 4, wherein said inductance element is formed by coiling a conductor on a toroidal bobbin.

* * * * *